(12) United States Patent
Yin et al.

(10) Patent No.: US 8,822,334 B2
(45) Date of Patent: Sep. 2, 2014

(54) SEMICONDUCTOR STRUCTURE AND METHOD FOR MANUFACTURING THE SAME

(75) Inventors: Haizhou Yin, Poughkeepsie, NY (US); Jun Luo, Beijing (CN); Zhijiong Luo, Poughkeepsie, NY (US); Huilong Zhu, Poughkeepsie, NY (US)

(73) Assignee: The Institute of Microelectronics, Chinese Academy of Science, Beijing (CN)

( * ) Notice: Subject to any disclaimer, the term of this patent is extended or adjusted under 35 U.S.C. 154(b) by 0 days.

(21) Appl. No.: 13/380,612

(22) PCT Filed: Apr. 18, 2011

(86) PCT No.: PCT/CN2011/072917
§ 371 (c)(1),
(2), (4) Date: Dec. 23, 2011

(87) PCT Pub. No.: WO2012/071843
PCT Pub. Date: Jun. 7, 2012

(65) Prior Publication Data
US 2012/0217589 A1    Aug. 30, 2012

(30) Foreign Application Priority Data

Dec. 3, 2010   (CN) .......................... 2010 1 0572616

(51) Int. Cl.
*H01L 21/44* (2006.01)
*H01L 29/45* (2006.01)
*H01L 21/285* (2006.01)
*H01L 29/66* (2006.01)

(52) U.S. Cl.
CPC ....... *H01L 29/6653* (2013.01); *H01L 29/66545* (2013.01); *H01L 29/456* (2013.01); *H01L 21/28518* (2013.01)
USPC .......................................... 438/663; 257/384

(58) Field of Classification Search
CPC ...................... H01I 21/28518; H01I 21/66545; H01I 21/66606; H01I 21/6653
USPC .................. 257/408, E21.435, E29.266, 384; 438/305, 664
See application file for complete search history.

(56) References Cited

U.S. PATENT DOCUMENTS 6,551,870 B1 *   4/2003   Ling et al. ..................... 438/217
7,098,514 B2 *   8/2006   Oh et al. ....................... 257/384
(Continued)

FOREIGN PATENT DOCUMENTS

| CN | 1585128 | 2/2005 |
|----|---------|--------|
| CN | 1983595 | 6/2007 |

(Continued)

OTHER PUBLICATIONS

Office Action dated Jun. 13, 2013 from The State Intellectual Property Office of the People's Republic of China in counterpart Chinese application No. 201010572616.8.

*Primary Examiner* — Vongsavanh Sengdara
(74) *Attorney, Agent, or Firm* — Morgan, Lewis & Bockius LLP (57) ABSTRACT

A method for manufacturing a semiconductor structure comprises: providing a substrate (100) on which a dummy gate stack is formed, forming a spacer (240) at sidewalls of the dummy gate stack, and forming a source/drain region (110) and a source/drain extension region (111) at both sides of the dummy gate stack; removing at least part of the spacer (240), to expose at least part of the source/drain extension region (111); forming a contact layer (112) on the source/drain region (110) and the exposed source/drain extension region (111), the contact layer (112) being [made of] one of $CoSi_2$, NiSi and $Ni(Pt)Si_{2-y}$, or combinations thereof, and a thickness of the contact layer (112) being less than 10 nm. Correspondingly, the present invention further provides a semiconductor structure which is beneficial to reducing contact resistance and can maintain excellent performance in a subsequent high temperature process.

5 Claims, 5 Drawing Sheets

(56) References Cited

U.S. PATENT DOCUMENTS

| | | | |
|---|---|---|---|
| 7,348,248 B2* | 3/2008 | Cheng | 438/301 |
| 8,207,040 B2* | 6/2012 | Chung et al. | 438/285 |
| 2004/0188765 A1* | 9/2004 | Narasimha et al. | 257/368 |
| 2004/0188766 A1* | 9/2004 | Narasimha et al. | 257/368 |
| 2005/0040472 A1* | 2/2005 | Oh et al. | 257/382 |
| 2005/0064690 A1* | 3/2005 | Amos et al. | 438/592 |
| 2006/0003533 A1* | 1/2006 | Kammler et al. | 438/300 |
| 2006/0131656 A1* | 6/2006 | Shin et al. | 257/369 |
| 2007/0020866 A1* | 1/2007 | Cheng | 438/301 |
| 2007/0063294 A1* | 3/2007 | Bu et al. | 257/408 |
| 2007/0102726 A1 | 5/2007 | Watanabe et al. | |
| 2007/0131930 A1* | 6/2007 | Aida et al. | 257/48 |
| 2008/0102573 A1* | 5/2008 | Liang et al. | 438/231 |
| 2008/0217780 A1* | 9/2008 | Detavernier et al. | 257/754 |
| 2009/0023261 A1 | 1/2009 | Hirano | |
| 2009/0321853 A1* | 12/2009 | Cheng | 257/410 |
| 2010/0102394 A1* | 4/2010 | Yamakawa et al. | 257/369 |
| 2011/0169058 A1* | 7/2011 | Frye et al. | 257/288 |
| 2012/0112249 A1* | 5/2012 | Yin et al. | 257/288 |
| 2012/0261761 A1* | 10/2012 | Wang et al. | 257/368 |
| 2012/0273785 A1* | 11/2012 | Moriguchi et al. | 257/53 |
| 2012/0273955 A1* | 11/2012 | Or-Bach et al. | 257/762 |

FOREIGN PATENT DOCUMENTS

| | | |
|---|---|---|
| CN | 101118927 A | 2/2008 |
| JP | 2009152342 | 7/2009 |

* cited by examiner

SEMICONDUCTOR STRUCTURE AND METHOD FOR MANUFACTURING THE SAME

CROSS REFERENCE TO RELATED APPLICATION

This application is a National Phase application of PCT Application No. PCT/CN2011/072917, filed on Apr. 18, 2011, entitled "semiconductor structure and method for manufacturing the same", which claimed priority to Chinese Application No. 201010572616.8, filed on Dec. 3, 2010. Both the PCT Application and the Chinese Application are incorporated herein by reference in their entireties.

FIELD OF THE INVENTION

The present invention relates to the semiconductor manufacturing technology, and particularly to a semiconductor structure and a method for manufacturing the same.

BACKGROUND OF THE INVENTION

A metal-oxide-semiconductor field-effect transistor (MOSFET) is a transistor that can be widely used in digital circuits and analog circuits.

Figure 8:
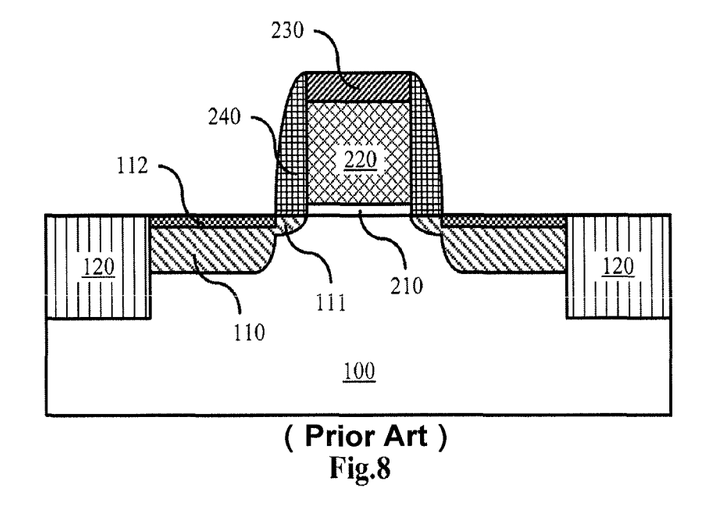
FIG. 8 is a cross-sectional schematic diagram of a conventional metal-oxide-semiconductor field-effect transistor.

FIG. 8 is a cross-sectional schematic diagram that shows a conventional metal-oxide-semiconductor field-effect transistor (MOSFET). As shown in FIG. 8, the MOSFET comprises: a substrate 100, a source/drain region 110, a source/drain extension region 111, a dummy gate stack and a spacer 240. The dummy gate stack is formed on the substrate 100, and comprises a gate dielectric layer 210, a dummy gate 220 and a cap layer 230. The source/drain region 110, formed in the substrate 100, is positioned at both sides of the dummy gate stack. The source/drain extension region 111 extends from the source/drain region 110 to beneath the dummy gate stack, with a thickness less than that of the source/drain region 110. The spacer 240 is positioned on the sidewall of the dummy gate stack and covers the source/drain extension region 111. A contact layer 112 is provided on the source/drain region 110 (which is beneficial to the reduction of contact resistance) for forming a metal silicide layer with respect to the Si-containing substrate. In the following, the description is made by taking the Si-containing substrate as an example, the contact layer being referred as the metal silicide layer.

Although the contact resistance between the source/drain region and the metal silicide layer can be reduced in the above method, the method is only limited to forming the metal silicide layer on the source/drain region, rather than forming the metal silicide layer on the source/drain extension region below the spacer, thereby being impossible to further reduce the contact resistance between the source/drain extension region and the metal silicide layer so as to improve the performance of the MOSFET. In addition, in the replacement gate process, it is necessary to remove the dummy gate stack after forming the metal silicide layer 112 and an interlayer dielectric layer for covering the source/drain region 110, and then form the gate dielectric layer of MOSFET formed by a high K dielectric material, so as to effectively reduce the leakage current of the gate. However, when the high K gate dielectric layer is formed, the molecular structure of the high K gate dielectric layer may have small defects. In order to repair the defect, it is necessary to perform annealing to the high K gate dielectric layer at a relatively high temperature (600° C.-800° C.). However, the metal or alloy used in the metal silicide layer in MOSFET cannot withstand the high temperature necessary for annealing the high K dielectric layer, and its structure will be changed at a high temperature, thereby increasing the resistivity of the metal silicide and thus degrading the performance of the transistor.

Therefore, it is a problem urgently to be solved to effectively reduce the contact resistance in the semiconductor structure while maintaining good performance of the semiconductor structure in the subsequent high temperature process.

SUMMARY OF THE INVENTION

The object of the invention is to provide a semiconductor structure and a method for manufacturing the same, which can not only reduce the contact resistance but also can maintain the performance of the semiconductor structure in high temperature processing.

According to one aspect of the invention, there provides a method for manufacturing a semiconductor structure, comprising:

providing a substrate on which a dummy gate stack is formed, forming a spacer at sidewalls of the dummy gate stack, and forming a source/drain region and a source/drain extension region at both sides of the dummy gate stack;

removing at least part of the spacer, to expose at least part of the source/drain extension region; and forming a contact layer on the source/drain region and the exposed source/drain extension region, the contact layer being made of one of $CoSi_2$, NiSi and $Ni(Pt)Si_{2-y}$, or combinations thereof, and a thickness of the contact layer being less than 10 nm.

Another aspect of the invention further provides a semiconductor structure, comprising a substrate, a source/drain region, a source/drain extension region and a gate, wherein:

the source/drain region and the source/drain extension region are formed in the substrate, the source/drain extension region has a thickness less than that of the source/drain region;

a contact layer is provided on an upper surface of the source/drain region and at least part of the source/drain extension region, the contact layer (112) being made of one of $CoSi_2$, NiSi and $Ni(Pt)Si_{2-y}$, or combinations thereof, and the thickness of the contact layer (112) being less than 10 nm.

Compared with the prior art, the invention has the following advantages.

By the technical solution provided in the invention, the contact layer can still have thermal stability at an annealing temperature (for example, 700° C.-800° C.) at which the gate stack is formed and the dummy gate stack is removed subsequently, and a relatively low resistance can be maintained at a high temperature up to 850° C., in such a case where a contact layer is not only formed on the source/drain region and on part, but also formed on part of or the whole source/drain extension region, the contact layer is made of one of $CoSi_2$, NiSi and $Ni(Pt)Si_{2-y}$ or combinations thereof, and the thickness of the contact layer is less than 10 nm. Therefore, the contact resistance can be reduced, and degradation of the performance of the semiconductor structure can be suppressed. In addition, since the thickness of the contact layer formed on the source/drain extension region is very small, and there may exist a certain distance between the contact layer and the PN junction between the source/drain extension region and the substrate when part of the sidewall is removed, which may not easily degrade the short channel effects, and it is beneficial to suppressing the generation of a relatively large leakage current.

BRIEF DESCRIPTION OF THE DRAWINGS

Additional features, objects and advantages of the present invention will become more apparent by reading the detailed descriptions on the non-limited embodiments made with reference to the following drawings.

DETAILED DESCRIPTION OF THE EMBODIMENTS

The embodiments of the present invention are described in detail as follows, the examples of which are shown in the drawings. The embodiments described as follows with reference to the drawings are exemplary, and are merely used to interpret the present invention rather than limiting the present invention The following disclosure provides many different embodiments or examples for implementing different structures of the present invention. In order to simplify the disclosure of the present invention, the components and arrangement of specific examples are described in the following text. Apparently, they are just exemplary, and do not intend to restrict the present invention. In addition, reference numbers and/or letters can be repeated in different examples of the present invention for the purposes of simplification and clearness, without indicating the relationships between the discussed embodiments and/or arrangements. Furthermore, the present invention provides examples of various specific processes and materials, but a person skilled in the art can realize the availability of other processes and/or usage of other materials. To be noted, the components as shown in the drawings are not always drawn to scale. In the present invention, the description of known assemblies as well as processing techniques and processes are omitted, so as to avoid any unnecessary restriction to the present invention.

Figure 1:
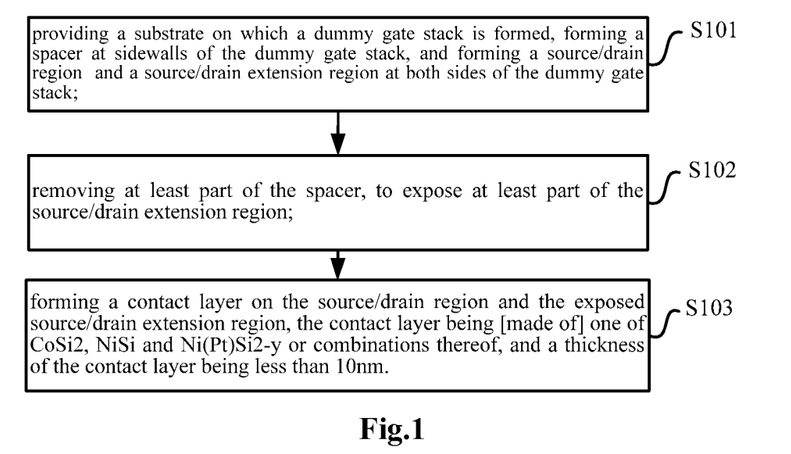
FIG. 1 is a flow chart of the method for manufacturing a semiconductor structure according to the present invention.

In the following, the method for forming the semiconductor structure in FIG. 1 is described in detail in combination with FIGS. 2-5.

Figure 2:
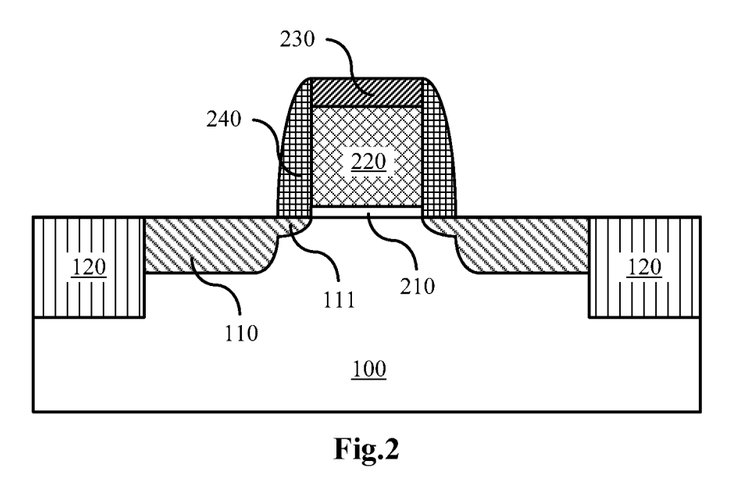
FIGS. 2-5 are cross-sectional schematic diagrams of each of the stages for manufacturing the semiconductor structure in accordance with the flow shown in FIG. 1 according to one preferred embodiment of the present invention.

Referring to FIGS. 1 and 2, in step S101, a substrate 100 is provided, a dummy gate stack is formed on the substrate 100, a spacer 240 is formed at sidewalls of the dummy gate stack, and a source/drain region 110 and a source/drain extension region 111 are formed at both sides of the dummy gate stack. The dummy gate stack comprises a gate dielectric layer 210, a dummy gate 220 and a cap layer 230.

In the embodiment, the substrate 100 comprises a silicon substrate (for example, a silicon wafer). According to the design requirement known in the prior art (for example, a P-type substrate or an N-type substrate), the substrate 100 can comprise various doped configurations. In other embodiments, the substrate 100 may further comprise other basic semiconductors (for example, III-V group materials), such as germanium. Alternatively, the substrate 100 may comprise a compound semiconductor, such as silicon carbide, gallium arsenide or indium arsenide. Typically, the substrate 100 can have, but not limited to, a thickness of about several hundreds of micrometers, for example, within the thickness of about 400 µm-800 µm.

Specifically, an isolation region can be formed in the substrate 100, for example, a shallow trench isolation (STI) structure 120, so as to electrically isolate continuous field effect transistors.

When a dummy gate stack is formed, a gate dielectric layer 210 is formed on the substrate 100 firstly. In the present embodiment, the gate dielectric layer 210 can be formed of silicon oxide, silicon nitride and a combination thereof. In other embodiments, the gate dielectric layer 210 can be formed of a high K dielectric, such as one of $HfO_2$, HfSiO, HfSiON, HfTaO, HfTiO, HfZrO, $Al_2O_3$, $La_2O_3$, $ZrO_2$ and LaAlO, or combinations thereof, with a thickness of about 2-10 nm. Afterwards, a dummy gate 220 is formed by depositing such as polycrystalline silicon, polycrystalline SiGe, noncrystalline silicon and/or doped or undoped silicon oxide, silicon nitride, silicon oxynitride and silicon carbide, or even metals, on the gate dielectric layer 210, with a thickness of about 10-80 nm. Finally, a cap layer 230 is formed on the dummy gate 220, for example, by depositing silicon nitride, silicon oxide, silicon oxynitride or silicon carbide, or combinations thereof, for protecting the top of the dummy gate 220, and preventing the top of the dummy gate 220 from reacting with the deposited metal layer in the subsequent process of forming the metal silicide layer. In another embodiment, the dummy gate stack may also not have the gate dielectric layer 210, and the gate dielectric layer is formed after the dummy gate stack is removed in the subsequent replacement gate process.

After the dummy gate stack is formed, firstly, a relatively shallow source/drain extension region 111 is formed in the substrate 100 in a way of low energy implantation. P-type or N-type dopants or impurities may be implanted into the substrate 100. For example, for a PMOS, the source/drain extension region 111 can be P-type doped SiGe; and for an NMOS, the source/drain extension region 111 can be N-type doped Si. Next, the semiconductor structure is subjected to annealing, so as to activate the dopants in the source/drain extension region 111. The annealing can be performed by other appropriate methods including rapid annealing and spike annealing. Since the thickness of the source/drain extension region 111 is relatively small, it is possible to effectively suppress short channel effects. Optionally, the source/drain extension region 111 can be formed after the formation of the source/drain region 110.

Next, a spacer 240 is formed on the sidewalls of the dummy gate stack, for isolating from the gate. The spacer 240 can be formed by silicon nitride, silicon oxide, silicon oxynitride, silicon carbide and the combination thereof, and/or other appropriate materials. The spacer 240 can have a multilayer structure. The spacer 240 may be formed by the processes including depositing and etching, with a thickness range of about 10 nm-100 nm, such as 30 nm, 50 nm or 80 nm.

Subsequently, the spacer 240 is taken as a mask, and the P-type or N-type dopants or impurities are implanted into the substrate 100, so as to form the source/drain region 110 at both sides of the dummy gate stack. For example, for a PMOS, the source/drain region 110 can be P-type doped SiGe; and for an NMOS, the source/drain region 110 can be N-type doped Si. The energy implanted to form the source/drain region 110 is larger than that implanted to form the source/drain extension region 111. Therefore, the formed source/drain region 110 has a thickness greater than that of the source/drain extension region 111, and presents a scalariform contour with the source/drain extension region 111. Afterwards, the semiconductor structure is subjected to annealing, so as to activate the dopants in the source/drain region 110. The annealing can be performed by other appropriate methods including rapid annealing and spike annealing.

Figure 3:
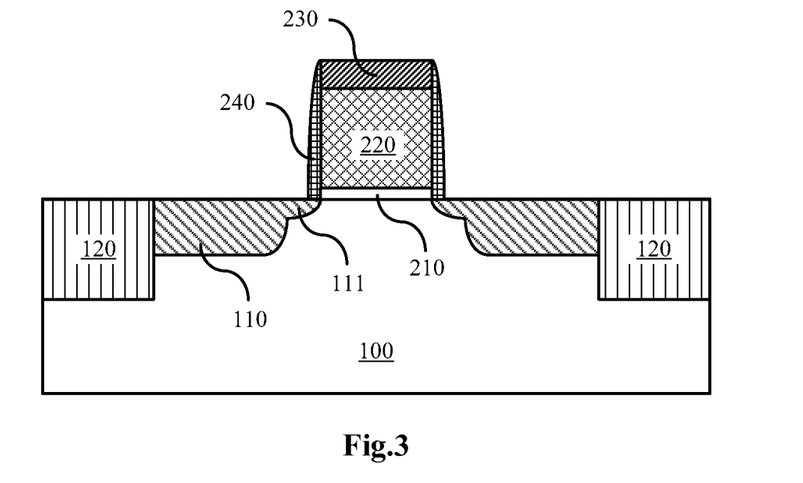

With reference to FIG. 1 and FIG. 3, in step S102, at least part of the spacer 240 is removed to expose at least part of the source/drain extension region 111. Specifically, the processes including wet etching and/or dry etching can be used to partially or completely remove the spacer 240 to partially or completely expose the source/drain extension region 111 below the spacer 240. Tetramethylammonium hydroxide (TMAH), potassium hydroxide (KOH), or other solutions suitable for etching may be used in the wet etching process. Sulfur hexafluoride ($SF_6$), hydrogen bromide (HBr), hydrogen iodide (HI), chlorine, argon, helium, hydrides of carbon such as methane (and methyl chloride), acethlene, ethylene and combinations thereof, and/or other appropriate materials may be used in the dry etching process.

If the dummy gate 220 is made of Si or metal, in order to avoid difficult separation of the metal for forming the metal silicide layer and the metal as the dummy gate in subsequent processes and avoid the influence to the size of the dummy gate stack, so as to prevent influence to the size of the structure of the gate stack formed after performing the replacement gate process, it is disadvantageous to completely remove the spacer 240. If the dummy gate 220 is made of a material which will not react with the deposited metal layer, the spacer 240 may be completely removed, so as to enlarge the region where the source/drain extension region 111 reacts with the deposited metal to the greatest extent, thereby reducing the contact resistance between the source/drain extension region and the metal silicide layer.

Figure 4:
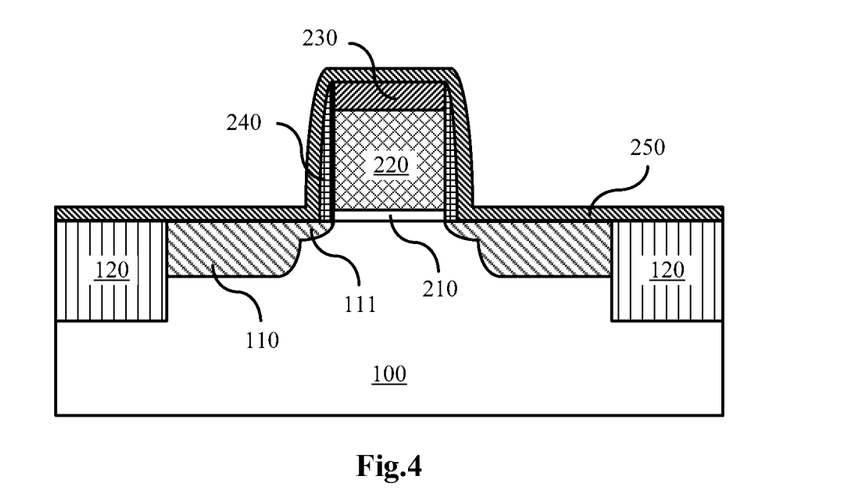

Referring to FIGS. 1 and 4, in step S103, a thin metal silicide layer 112 is formed on the source/drain region 110 and on the upper surface of the source/drain extension region 111 which is exposed after at least part of the spacer 240 is removed. Specifically, a thin metal layer 250 is deposited to evenly cover the substrate 100 and the dummy gate stack, and a thin metal silicide layer 112 is formed on the source/drain region 110 and the upper surface of the exposed region of the source/drain extension region 111 after annealing. By selecting the thickness and the material of the deposited metal layer 250, it is possible to make the formed metal silicide layer 112 still have thermal stability at a high temperature (such as 850° C.), to maintain a relatively low resistivity and to be beneficial to the reduction of the increase of the resistivity of the metal silicide layer 112 caused by high temperature annealing in the subsequent semiconductor structure manufacturing process. The material of the metal layer 250 comprises one of Co, Ni and NiPt or any combination thereof.

If the material of the metal layer 250 is Co, the thickness of the metal layer 250 formed by Co is less than 5 nm.

Figure 6:
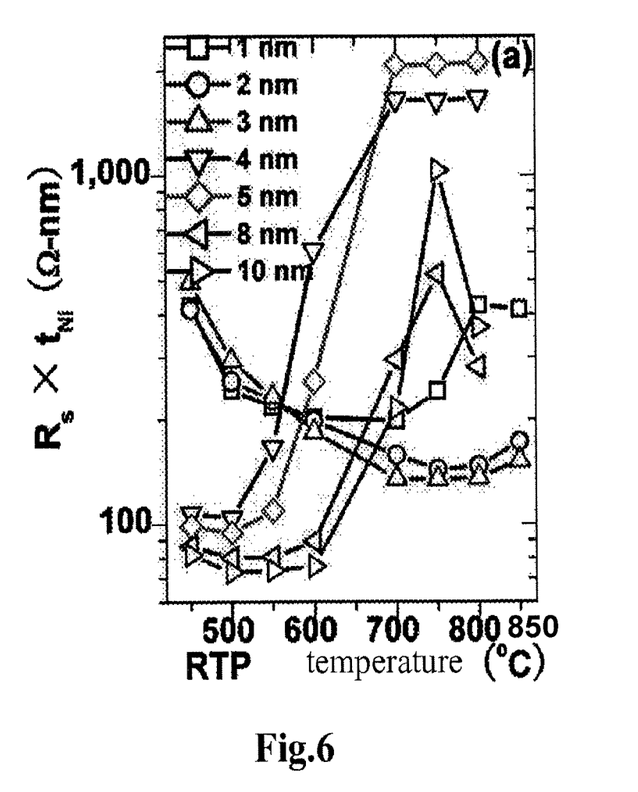
FIG. 6 shows a resistivity of a nickel-silicide formed by depositing a Ni layer with different thicknesses at different temperatures.

If the material of the metal layer 250 is Ni, with reference to FIG. 6, the thickness of the metal layer 250 formed by Ni is less than 4 nm, preferably 2-3 nm. FIG. 6 shows the resistance of a nickel-silicide formed by depositing the Ni layer with different thicknesses at different temperatures, the horizontal coordinates representing a temperature at which the rapid thermal processing (PRT) is performed, and the vertical coordinates representing a resistance of the nickel-silicide. Different curves represent the deposited Ni layer with different thicknesses when the nickel-silicide is formed. It can be seen from FIG. 6 that when the temperature of the rapid thermal processing is higher than 700° C., the thickness of the deposited metal Ni layer is about 2-3 nm, and the resistance of the formed nickel-silicide is relatively low. When the material of the metal layer 250 is Ni, the thickness of the formed metal silicide 112 is about twice that of the metal layer 250. For example, when the thickness of the deposited Ni layer is 4 nm, the thickness of the formed NiSi is about 8 nm.

Figure 7:
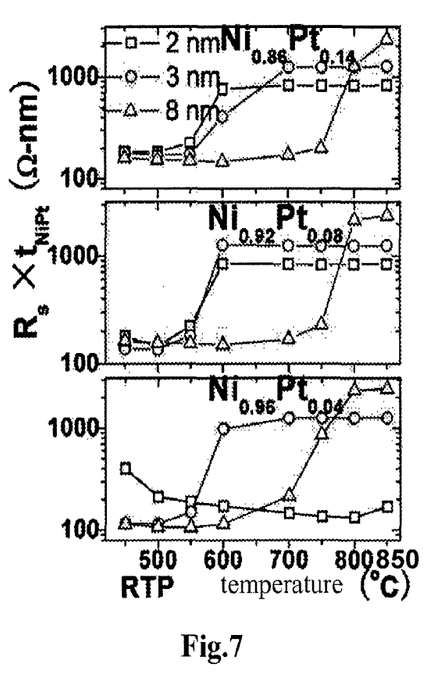
FIG. 7 shows a resistivity of a nickel platinum-silicide formed by depositing a NiPt layer with different thicknesses and components at different temperatures.

If the material of the metal layer 250 is NiPt, with reference to FIG. 7, the thickness of the metal layer 250 formed by NiPt is less than 3 nm, and the content of Pt in the NiPt is less than 5%. FIG. 7 shows the resistance of the nickel platinum-silicide formed by depositing the NiPt layer with different thicknesses at different temperatures. In FIG. 7, there are upper, middle and lower graphs, the horizontal coordinates representing a temperature at which the rapid thermal processing is performed, and the vertical coordinates representing the resistance of the nickel platinum-silicide. Different curves in the upper graph represent the NiPt layers with different thicknesses when the metal layer 250 is NiPt, the content of Ni is 86% and the content of Pt is 14%. Different curves in the middle graph represent the NiPt layers with different thicknesses when the metal layer 250 is NiPt, the content of Ni is 92% and the content of Pt is 8%. Different curves in the lower graph represent the NiPt layer with different thicknesses when the metal layer 250 is NiPt, the content of Ni is 96% and the content of Pt is 4%. It can be seen from FIG. 7 that the resistivity of the formed nickel platinum-silicide is relatively low, that is, the thermal stability is relatively good under the circumstance where the content of Pt in the deposited NiPt layer is 4% and the thickness of the NiPt layer is 2 nm when the temperature of the rapid thermal processing is higher than 700° C. Therefore, if the material of the metal layer 250 is NiPt, the thickness of the metal layer 250 formed by NiPt is less than 3 nm. Preferably, the content of Pt in NiPt is less than 5%.

After the metal layer 250 is deposited, the semiconductor structure is annealed. After annealing, the metal silicide layer 112 is formed on the source/drain region 110, and on the upper surface of the exposed region of the source/drain extension region 111. The metal silicide layer 112 comprises one of $CoSi_2$, NiSi and $Ni(Pt)Si_{2-y}$, or combinations thereof, with the thickness less than 10 nm. Finally, the residual metal layer 250 which is unreacted in the reaction of forming the metal silicide 112 is removed by means of selective etching.

Subsequently, the semiconductor structure will be manufactured according to the steps of the conventional semiconductor manufacturing process. For example, an interlayer dielectric layer may be deposited on the substrate of the semiconductor structure; then the replacement gate process may be performed, and the high K gate dielectric layer may be subjected to annealing; and the interlayer dielectric layer is etched to form a contact hole, and then a contact metal is filled in the contact hole to form a contact plug. Since the above conventional manufacturing processes are well known for persons skilled in the art, it is unnecessary to give more details.

After the above steps being completed, in the semiconductor structure, the metal silicide layer 112 is formed not only on the source/drain region 110 but also on the source/drain extension region 111, which reduces the contact resistance and improves the performance of the semiconductor structure. The metal silicide layer 112 also has thermal stability, and can maintain a relatively low resistance at a high temperature up to 850° C. Therefore, even if there is a high temperature processing in the subsequent process, for example, the high K gate dielectric layer may be subjected to high temperature annealing in the replacement gate process, the resistance of the metal silicide layer 112 will not increase, which is beneficial to the reduction of performance degradation of the semiconductor structure. In addition, since the thickness of the metal silicide layer 112 is less than 10 nm and there may exist a certain distance between the metal silicide layer 112 and the interfacial surface between the source/drain extension region and the substrate, which may not easily degrade the short channel effect, and it is beneficial to suppressing the generation of relatively large junction leakage current. For better understanding of the semiconductor structure formed according to the above method for manufacturing the semiconductor structure, the semiconductor structure is explained below with reference to FIG. 5.

Figure 5:
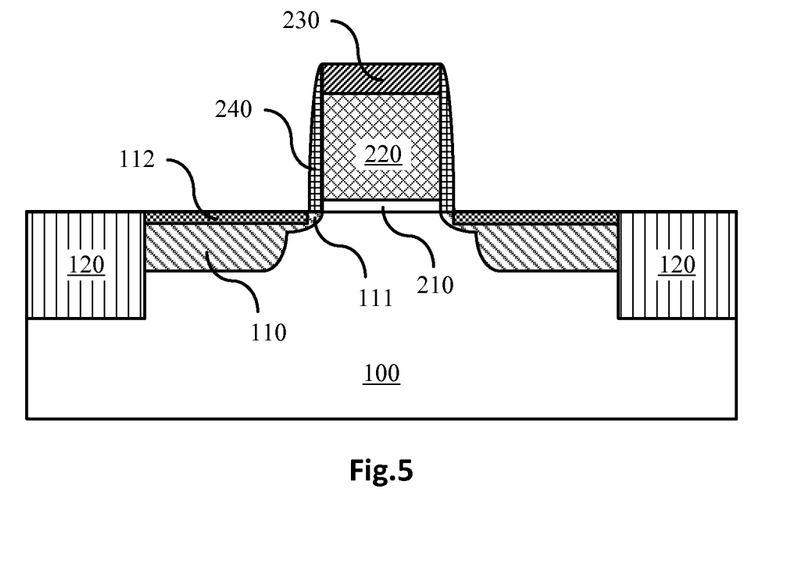

FIG. 5 is a cross-sectional diagram of the finally formed semiconductor structure after the steps shown in FIG. 1 are performed. In the present embodiment, the semiconductor structure comprises: a substrate 100, a source/drain region 110, and a source/drain extension region 111, wherein the source/drain region 110 and the source/drain extension region 111 are formed in the substrate 100; the source/drain extension region 111 has a thickness less than that of the source/drain region 110, and presents a scalariform contour with the source/drain region 110. Since the thickness of the source/drain extension region 111 is relatively small, it is possible to effectively reduce the short channel effects.

The metal silicide layer 112 is formed on the source/drain region 110 and on the upper surface of at least part of the source/drain extension region 111, which reduces the contact resistance, thereby improving the performance of the semiconductor structure. The metal silicide layer 112 comprises one of $CoSi_2$, NiSi and $Ni(Pt)Si_{2-y}$, or combinations thereof, and the thickness of the metal silicide layer 112 is less than 10 nm. Since the metal silicide layer 112 has thermal stability and can maintain a relatively low resistance at a high temperature up to 850° C., even if there is a high temperature processing in the subsequent process, for example, the high K gate dielectric layer is subjected to high temperature annealing in the replacement gate process, the resistance of the metal silicide layer 112 will not increase, which is beneficial to suppressing the degradation of the performance of the semiconductor structure. In addition, since the thickness of the metal silicide layer 112 is relatively small, and there may exist a certain distance between the metal silicide layer 112 and the interfacial surface between the source/drain extension region and the substrate, which may not easily degrade the short channel effect, and it is beneficial to suppressing the generation of a relatively large junction leakage current.

Preferably, the dummy gate 220 can be formed by a material which does not react with the deposited metal layer 250. The material comprises, but not limited to, oxide, nitride and any combination thereof. Under this circumstance, it is not necessary to specially protect the dummy gate 220. Therefore, it is possible to completely remove the spacer 240, so as to expose the source/drain extension region 111 to the greatest extent, and to enlarge the region where the source/drain extension region 111 reacts with the metal layer 250, thereby reducing the contact resistance between the source/drain extension region and the metal silicide layer and improving the performance of the semiconductor structure.

The structure component, materials and forming methods of each of the parts in embodiments of the semiconductor structure can be the same as what are described in the embodiments of the method for forming said semiconductor structure, and therefore are not repeated here.

Although the exemplary embodiments and the advantages thereof are explained in detail, it is to be understood that various changes, substitutions and amendments may be made to the embodiments without departing from the spirit of the invention and the protection scopes defined in the accompanying claims. With respect to other examples, it will be easily understood by a person skilled in the art that the sequence of the processing steps may be changed while maintaining the protection scope of the present invention.

Furthermore, the application scope of the present invention is not limited to the processes, structures, manufacturing, compositions, means, methods and steps of the specific embodiments as described in the specification. According to the disclosure of the present invention, a person skilled in the art will easily appreciate that when the processes, structures, manufacturing, compositions, means, methods and steps currently existing or to be developed in future are adopted to perform functions substantially the same as corresponding embodiments described in the present invention, or achieve substantially the same effects, a person skilled in the art can make applications of them according to the present invention. Therefore, the accompanied claims of the present invention intend to include these processes, structures, manufacturing, compositions, means, methods and steps within their protection scopes.

What is claimed is:

1. A method for manufacturing a semiconductor structure, comprising:
    a) providing a substrate on which a dummy gate stack is formed, forming a spacer at sidewalls of the dummy gate stack, and forming a source/drain region and a source/drain extension region at both sides of the dummy gate stack;
    b) removing at least part of the spacer to expose at least part of the source/drain extension region;
    c) forming a contact layer on the source/drain region and the exposed source/drain extension region, the contact layer being made of one of $CoSi_2$, NiSi and $Ni(Pt)Si_{2-y}$ or combinations thereof, and a thickness of the contact layer being less than 10 nm; and
    d) performing a replacement gate process, wherein a high K gate dielectric layer is subjected to annealing at a temperature ranging from 700° C. to 850° C. after the formation of the contact layer.

2. The method according to claim 1, wherein step c) comprises:
    forming a metal layer to cover the substrate, the dummy gate stack and the spacer, the metal layer comprising one of Co, Ni and NiPt or combinations thereof;
    performing an annealing operation so that the metal layer reacts with surfaces of both the source/drain region and the exposed source/drain extension region; and
    removing the metal layer which is unreacted.

3. The method according to claim 2, wherein:
    the thickness of Co is less than 5 nm if the material of the metal layer is Co;
    the thickness of Ni is less than 4 nm if the material of the metal layer is Ni; and
    the thickness of NiPt is less than 3 nm if the material of the metal layer is NiPt.

4. The method according to claim 2, wherein:
    a content of Pt in NiPt is less than 5% if the material of the metal layer is NiPt.

5. The method according to claim 1, wherein:
    the thickness of the contact layer is less than 6 nm.

* * * * *